United States Patent
Zhu et al.

(10) Patent No.: US 12,153,244 B2
(45) Date of Patent: Nov. 26, 2024

(54) METHOD FOR MANUFACTURING LIGHT-MIXING PLATE, LIGHT-MIXING PLATE, AND BACKLIGHT MODULE

(71) Applicants: Beijing BOE Optoelectronics Technology Co., Ltd., Beijing (CN); BOE Technology Group Co., Ltd., Beijing (CN)

(72) Inventors: Yuanyuan Zhu, Beijing (CN); Rui Han, Beijing (CN); Dong Cui, Beijing (CN); Zhipeng Zhang, Beijing (CN); Yue Zhai, Beijing (CN); Weining Chi, Beijing (CN); Fengping Wang, Beijing (CN); Shouyang Leng, Beijing (CN); Binxin Song, Beijing (CN); Wenyang Li, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/769,957

(22) PCT Filed: Mar. 15, 2021

(86) PCT No.: PCT/CN2021/080856
§ 371 (c)(1),
(2) Date: Apr. 18, 2022

(87) PCT Pub. No.: WO2022/193094
PCT Pub. Date: Sep. 22, 2022

(65) Prior Publication Data
US 2024/0134108 A1    Apr. 25, 2024
US 2024/0230977 A9    Jul. 11, 2024

(51) Int. Cl.
*F21V 8/00* (2006.01)

(52) U.S. Cl.
CPC ......... *G02B 6/0055* (2013.01); *G02B 6/0035* (2013.01); *G02B 6/0065* (2013.01)

(58) Field of Classification Search
CPC ... G02B 6/0055; G02B 6/0035; G02B 6/0065
See application file for complete search history.

(56) References Cited

U.S. PATENT DOCUMENTS

| | | | |
|---|---|---|---|
| 2012/0250327 A1* | 10/2012 | Wang | H01H 13/83 362/253 |
| 2013/0021781 A1* | 1/2013 | Sonoda | G09G 3/3433 427/164 |
| 2020/0033531 A1* | 1/2020 | Han | G02B 6/0086 |

FOREIGN PATENT DOCUMENTS

| | | |
|---|---|---|
| CN | 110277430 A | 9/2019 |
| CN | 110568542 A | 12/2019 |
| CN | 110828695 A | 2/2020 |

(Continued)

*Primary Examiner* — Evan P Dzierzynski
*Assistant Examiner* — Jessica M Apenteng
(74) *Attorney, Agent, or Firm* — IPro, PLLC (57) ABSTRACT

Provided is a method for manufacturing a light-mixing plate. The method includes disposing a plurality of shielding structures on a transparent substrate; forming a light-shielding film layer on the transparent substrate where the plurality of shielding structures are disposed, wherein a hole is formed at a position, corresponding to each of the plurality of shielding structures, of the light-shielding film layer; and removing the plurality of shielding structures.

14 Claims, 7 Drawing Sheets

(56) References Cited

FOREIGN PATENT DOCUMENTS

| | | |
|---|---|---|
| CN | 111505865 A | 8/2020 |
| JP | 2534852 B2 | 9/1996 |

* cited by examiner

FIG. 14 ically cured at 140° C. to 160°
METHOD FOR MANUFACTURING LIGHT-MIXING PLATE, LIGHT-MIXING PLATE, AND BACKLIGHT MODULE

CROSS-REFERENCE TO RELATED APPLICATION

This application is a U.S. national stage of international application No. PCT/CN2021/080865, filed on Mar. 15, 2021, the content of which is herein incorporated by reference in its entirety.

TECHNICAL FIELD

The present disclosure relates to the field of display technologies, and in particular, relates to a method for manufacturing a light-mixing plate, a light-mixing plate, and a backlight module.

BACKGROUND

A backlight module, as an assembly in a display device, provides a light source. The backlight module includes a light-mixing plate provided with a plurality of light-transmitting holes to achieve uniform brightness.

Currently, according to a method for manufacturing a light-mixing plate, the light-mixing plate provided with the plurality of light-transmitting holes is formed by drilling holes in a non-transparent substrate with a drilling bit.

SUMMARY

Embodiments of the present disclosure provide a method for manufacturing a light-mixing plate, a light-mixing plate, and a backlight module. The technical solutions are as follows.

According to one aspect of the present disclosure, a method for manufacturing a light-mixing plate is provided. The method includes:
  acquiring a transparent substrate;
  disposing a plurality of shielding structures on the transparent substrate;
  forming a light-shielding film layer on the transparent substrate where the plurality of shielding structures are disposed, wherein a hole is formed at a position, corresponding to each of the plurality of shielding structures, of the light-shielding film layer; and
  removing the plurality of shielding structures.

Optionally, forming the light-shielding film layer on the transparent substrate where the plurality of shielding structures are disposed includes:
  forming a light-shielding material layer on the transparent substrate where the plurality of shielding structures are disposed; and
  forming the light-shielding film layer by curing the light-shielding material layer.

Optionally, forming the light-shielding material layer on the transparent substrate where the plurality of shielding structures are disposed includes: forming the light-shielding material layer by applying a light-shielding material onto the transparent substrate by a sprayer or a brush head.

Optionally, forming the light-shielding film layer by curing the light-shielding material layer includes:
  forming the light-shielding film layer by thermally curing the light-shielding material layer, wherein the light-shielding material is thermally cured at 140° C. to 160° C. and for 0.3 to 0.7 hours.

Optionally, forming the light-shielding material layer on the transparent substrate where the plurality of shielding structures are disposed includes:
  forming the light-shielding material layer by placing the transparent substrate where the plurality of shielding structures are disposed into a light-shielding material.

Optionally, disposing the plurality of shielding structures on the transparent substrate includes:
  acquiring a screen plate assembly, wherein the screen plate assembly includes a screen plate and the plurality of shielding structures connected to the screen plate; and
  disposing the screen plate assembly on the transparent substrate, wherein the plurality of shielding structures are in contact with the transparent substrate.

Optionally, the shielding structure includes a shielding block and a connecting rod connected to the shielding block, wherein the connecting rod is connected to the screen plate.

Optionally, removing the plurality of shielding structures includes:
  removing the plurality of shielding structures from the transparent substrate by moving the screen plate.

According to another aspect, a light-mixing plate is provided. The light-mixing plate is applicable to a backlight module and includes:
  a transparent substrate; and
  a light-shielding film layer disposed on the transparent substrate, wherein the light-shielding film layer is provided with a plurality of holes.

Optionally, a material of the light-shielding film layer includes a reflecting material.

Optionally, the reflecting material includes white oil.

Optionally, a radius of the holes ranges from 0.225 mm to 1.45 mm; and a minimum distance between centers of any adjacent two holes of the plurality of holes is greater than 2 mm.

Optionally, the transparent substrate includes a top face, a bottom face, and a side face connecting the top face to the bottom face; and the light-shielding film layer includes a first light-shielding film layer disposed on the top face and a second light-shielding film layer disposed on the bottom face.

Optionally, holes in the first light-shielding film layer are in one-to-one correspondence with and opposite to holes in the second light-shielding film layer.

Optionally, the centers of the plurality of holes are uniformly distributed in the light-shielding film layer.

According to another aspect, a backlight module is provided. The backlight module includes a base substrate, a plurality of light-emitting devices, and the light-mixing plate according to the another aspect; wherein the plurality of light-emitting devices are disposed on the base substrate, and the light-mixing plate is disposed on a side, distal from the base substrate, of the plurality of light-emitting devices.

Optionally, the light-mixing plate includes a plurality of light-mixing regions; wherein the plurality of light-mixing regions are in one-to-one correspondence with the plurality of light-emitting devices, and an orthographic projection of each of the plurality of light-emitting devices on the light-mixing plate falls within a corresponding light-mixing region; wherein in a first light-mixing region of the plurality of light-mixing regions, a size of a first hole is positively correlated with a first distance, the first distance being a distance between the first hole and the light-emitting device corresponding to the first light-mixing region.

Optionally, in the light-mixing plate, the light-shielding film layer is disposed on a side, proximal to the light-emitting device, of a transparent substrate; or the light-shielding film layer is disposed on a side, distal from the light-emitting device, of the transparent substrate.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

The above accompanying drawings have illustrated specific embodiments of the present disclosure, and are described in detail hereinafter. These accompanying drawings and text descriptions are not intended to limit the scope of the concept of the present disclosure in any way, but to illustrate the conception of the present disclosure for those skilled in the art with reference to particular embodiments.

DETAILED DESCRIPTION

For clearer descriptions of the objectives, technical solutions, and advantages of the present disclosure, embodiments of the present disclosure are described in detail hereinafter with reference to the accompanying drawings.

A backlight module, as an assembly in a display device, is configured to provide a light source. The backlight module includes a light-mixing plate provided with a plurality of light-transmitting holes to achieve uniform brightness. The backlight module may be a direct backlight module. The direct backlight module has the advantages of uniform brightness, delicate and realistic picture details, and the like. However, because the light source is disposed at the rear of the display device, the entire display device including a display panel is relatively thick, which cannot meet a need of people for thinning of a display device. However, wherein a thickness of the backlight module is reduced, uniformity of light emitted by the backlight module is affected (a phenomenon of "lamp shadow" may be caused), thereby affecting a display effect of the backlight module. For this problem, a solution of adding a light-mixing plate provided with light-transmitting holes to the backlight module may improve a light-homogenizing capability of a device in a backlight. In this way, the thickness of the backlight module can be reduced on the premise that uniform light is emitted by the backlight.

Conventionally, in a method for manufacturing a light-mixing plate, a light-mixing plate provided with a plurality of light-transmitting holes is formed by drilling holes in a non-transparent substrate with a drilling bit.

The method may damage the substrate in the drilling process with the drilling bit. As a result, this method has a relatively high requirement for the manufacture technology and relatively high manufacture difficulty, causing a problem of a lower manufacture yield of the light-mixing plate.

The embodiments of the present disclosure provide a method for manufacturing a light-mixing plate, a light-mixing plate, and a backlight module, to resolve the problem in the related art.

Figure 1:
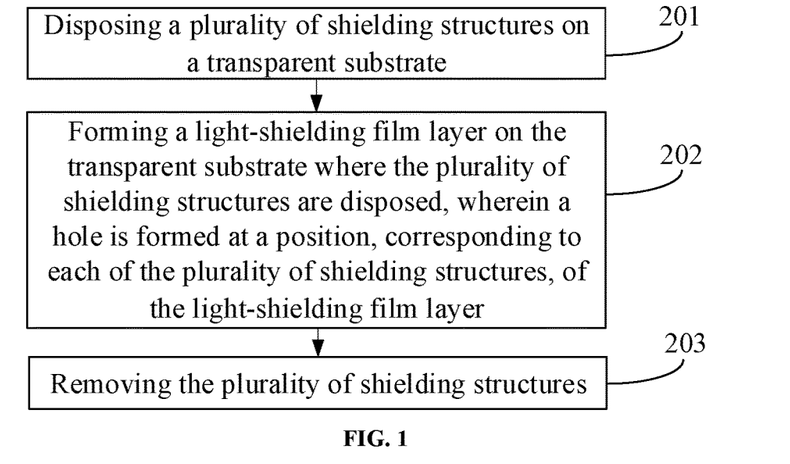
FIG. 1 is a flowchart of a method for manufacturing a light-mixing plate according to an embodiment of the present disclosure.

FIG. 1 is a flowchart of a method for manufacturing a light-mixing plate according to an embodiment of the present disclosure. The method may include the following processes.

In S201, a plurality of shielding structures are disposed on a transparent substrate.

In S202, a light-shielding film layer is formed on the transparent substrate where the plurality of shielding structures are disposed, wherein a hole is formed at a position, corresponding to each of the plurality of shielding structures, of the light-shielding film layer.

In S203, the plurality of shielding structures are removed.

In summary, the present disclosure provides a method for manufacturing a light-mixing plate. The method includes: forming a light-shielding film layer on a transparent substrate by disposing a plurality of shielding structures on the transparent substrate, such that holes are formed in regions, shielded by the plurality of shielding structures, of the light-shielding film layer. After the plurality of shielding structures are removed, the light-shielding film layer including a plurality of light-transmitting holes and the transparent substrate can implement a function of the light-mixing plate. According to the method, it is unnecessary to drill a hole in the transparent substrate, which reduces the possibility of damages to the transparent substrate. Therefore, the problem of a relative low manufacture yield of the light-mixing plate in the related art can be resolved, and the manufacture yield of the light-mixing plate can be improved.

Figure 2:
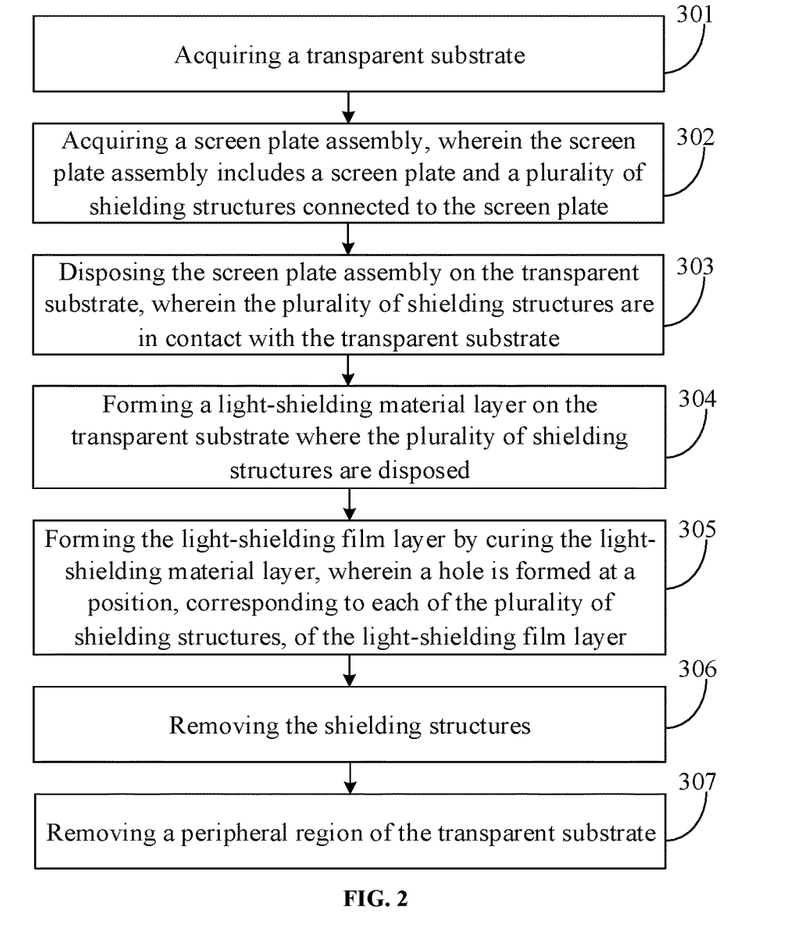
FIG. 2 is a flowchart of another method for manufacturing a light-mixing plate according to an embodiment of the present disclosure.

FIG. 2 is a flowchart of another method for manufacturing a light-mixing plate according to an embodiment of the present disclosure. The method may include the following processes:

In S301, a transparent substrate is acquired.

The transparent substrate may be made of a material of a relatively high transmittance. Optionally, the transmittance of the transparent substrate may be greater than or equal to 90%.

For example, the transparent substrate may be glass with a thickness of 0.5 mm, or a polycarbonate plate with a thickness of 1.0 mm.

The transparent substrate may include a light-homogenizing functional region and a peripheral region disposed at a periphery of the light-homogenizing functional region. The light-homogenizing functional region is configured to implement a light-homogenizing function by subsequent processing. The peripheral region may be configured to implement some auxiliary functions in the manufacture process. For example, the peripheral region may include an alignment marker configured to implement some alignment operations in the manufacture process. The alignment marker in the peripheral region may be T-shaped, cruciform, or the like, which is not limited in the embodiments of the present disclosure.

The transparent substrate may be in a rectangular shape. The light-homogenizing functional region may further be in a rectangular shape. A distance between an edge of the light-homogenizing functional region and an edge of the transparent substrate is greater than or equal to 5 mm.

In S302, a screen plate assembly is acquired, wherein the screen plate assembly includes a screen plate and a plurality of shielding structures connected to the screen plate.

The shielding structure may include a shielding block and a connecting rod connected to the shielding block. The connecting rod is connected to the screen plate. The shielding block may be in a cylindrical shape, may be made of a material with a relatively high dimensional stability, such as die steel 5CrMnMo or Cr12, and may be manufactured to be a cylindrical shape by machining.

Flatness of the screen plate assembly is less than or equal to 0.05 mm, which can improve accuracy of the subsequent processes.

The die steel 5CrMnMo is steel formed by mainly adding three elements chromium (Cr), manganese (Mn), and molybdenum (Mo) into medium carbon steel.

Cr12 is alloy tool steel and has a relatively high hardenability and a high abrasion resistance.

Figure 3:
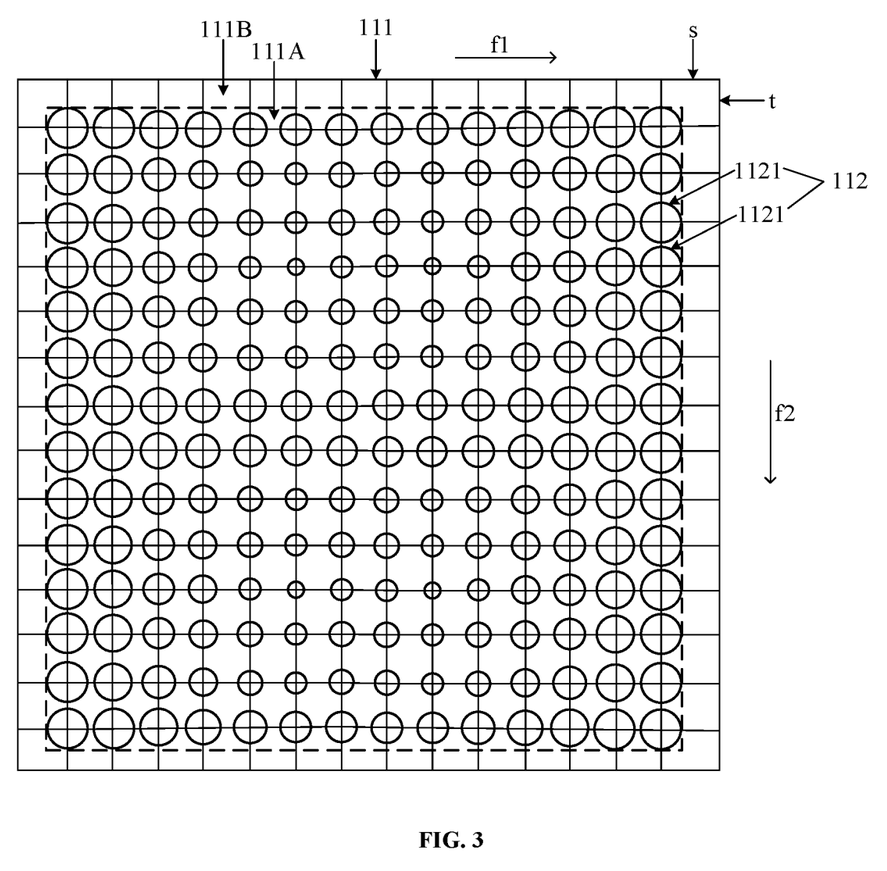
FIG. 3 is a schematic diagram of a top-viewed structure on a side of a screen plate of a screen plate assembly according to an embodiment of the present disclosure.

The screen plate is a reticular structure composed of a plurality of rods that are in a crossing fashion. As shown in FIG. 3, FIG. 3 is a schematic diagram of a top-viewed structure on a side of a screen plate of a screen plate assembly according to an embodiment of the present disclosure. For example, the screen plate 111 may include a plurality of rods s arranged along a first direction f1 and a plurality of rods t arranged along a second direction f2. The first direction f1 is perpendicular to the second direction f2. Intersections between the plurality of rods arranged along the first direction f1 and the plurality of rods arranged along the second direction f2 are respectively connected to the plurality of shielding structures.

The screen plate may include a middle region and a peripheral region disposed at a periphery of the middle region. The middle region is connected to the shielding structures. The peripheral region may be configured to implement some auxiliary functions in the manufacture process. For example, the peripheral region may include an alignment marker configured to implement some alignment operations in the manufacture process. The alignment marker in the peripheral region may be T-shaped, cruciform, or the like, which is not limited in the embodiments of the present disclosure.

The screen plate may be in a rectangular shape. The middle region may further be in a rectangular shape. A distance between an edge of the middle region and an edge of the screen plate is greater than or equal to 5 mm.

The alignment marker on the transparent substrate may be matched with the alignment marker on the screen plate in shape, and may be configured to determine and calibrate relative positions of the transparent substrate and the screen plate assembly.

As shown in FIG. 3, a screen plate 111 may include a middle region 111A and a peripheral region 111B disposed at a periphery of the middle region 111A. The middle region 111A is connected to the shielding structure 112. The shielding structure 112 includes a plurality of shielding blocks 1121. Distances between any adjacent central points of the plurality of shielding blocks 1121 are the same. The screen plate 111 is disposed on a side, distal from the shielding block 1121, of the connecting rod.

Figure 4:
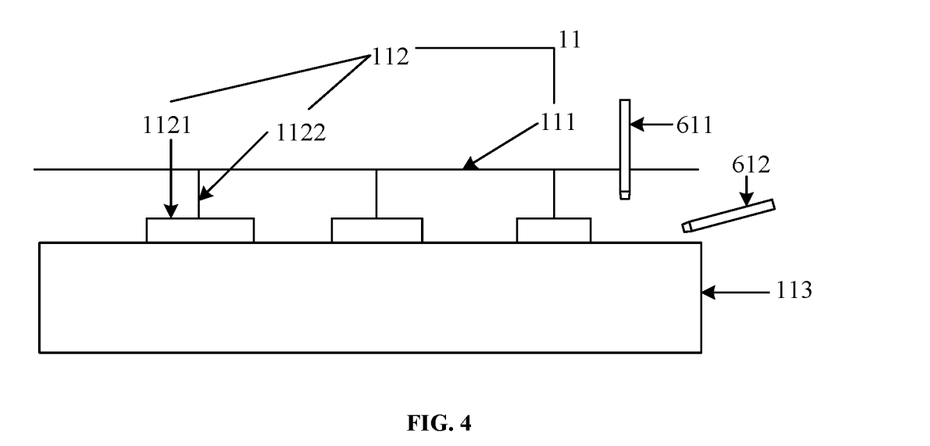
FIG. 4 is a locally schematic diagram of a side-viewed structure of the screen plate assembly shown in FIG. 3.

As shown in FIG. 4, FIG. 4 is a locally schematic diagram of a side-viewed structure of the screen plate assembly shown in FIG. 3. The screen plate assembly 11 includes a screen plate 111 and a plurality of shielding structures 112 connected to the screen plate 111. The shielding structure 112 includes a shielding block 1121 and a connecting rod 1122 connected to the shielding block 1121. The connecting rod 1122 is connected to the screen plate 111. The connecting rod 1122 and the screen plate 111 may be connected to each other by welding.

For example, the radius of the shielding block may range from 0.225 mm to 1.45 mm. In the manufacture process, a machining tolerance may be added to an actual value of the radius of the shielding block. The thickness range of the shielding block may range from 0.15 mm to 0.25 mm.

The radius of the shielding block may further range from 0.225 mm to 0.625 mm.

In S303, the screen plate assembly is disposed on the transparent substrate, wherein the plurality of shielding structures are in contact with the transparent substrate.

After the screen plate assembly is disposed on the transparent substrate, the shielding structures in the screen plate assembly may be in contact with the transparent substrate, thereby preventing a light-shielding material from being subsequently applied in regions, in contact with the transparent substrate, of the plurality of shielding structures.

As shown in FIG. 4, the shielding blocks 1121 in the plurality of shielding structures 112 are in contact with the transparent substrate 113.

For example, the transparent substrate may be disposed in a limiting fixture; and then, the screen plate assembly may be aligned with the transparent substrate via the alignment markers; and finally, the screen plate assembly may be disposed, based on an aligned position, in the limiting fixture where the transparent substrate is disposed, such that the screen plate assembly is disposed at positions, in contact with the transparent substrate, of the plurality of shielding blocks. The limiting fixture may be configured to fix the transparent substrate and the screen plate assembly.

In S304, a light-shielding material layer is formed on the transparent substrate where the plurality of shielding structures are disposed.

The light-shielding material may include a reflecting material. The light-shielding material layer is provided with a plurality of holes in one-to-one correspondence with the plurality of shielding structures.

S304 may be performed in the following two fashions.

First: the light-shielding material layer is formed by applying the light-shielding material onto the transparent substrate by a sprayer or a brush head.

As shown in FIG. 4, the connecting rod 1122 in the screen plate assembly 11 may enlarge a distance between the transparent substrate 113 and the screen plate 111, such that a plurality of sprayers 611 may be extended into a gap between the screen plate 111 and the transparent substrate 113 through a plurality of mesh holes in the screen plate 111, and the light-shielding material layer is formed by spraying the light-shielding material onto the transparent substrate 113 by the sprayers 611.

Optionally, the plurality of sprayers 612 may be extended into the gap between the screen plate assembly 11 and the transparent substrate 113 from outer edges of the screen plate assembly 11 and the transparent substrate 113, thereby forming the light-shielding material layer with a leveling fashion by spraying the light-shielding material.

Optionally, a plurality of brush heads may be extended into the gap between the screen plate and the transparent substrate through the plurality of mesh holes in the screen plate, and the light-shielding material layer is formed by coating the transparent substrate with the light-shielding material via the brush heads.

Second: the light-shielding material layer is formed by placing the transparent substrate where the plurality of shielding structures are disposed into the light-shielding material.

The shielding structure is fixed after being in contact with the transparent substrate; and then, the light-shielding material layer is formed by immersing the transparent substrate where the plurality of shielding structures are disposed into the light-shielding material. It should be noted that, in fashion 2, some white oil may further be disposed on a side, distal from the plurality of shielding structures, of the transparent substrate. The white oil may be removed prior to S305, thereby preventing light from penetrating the light-mixing plate.

Figure 5:
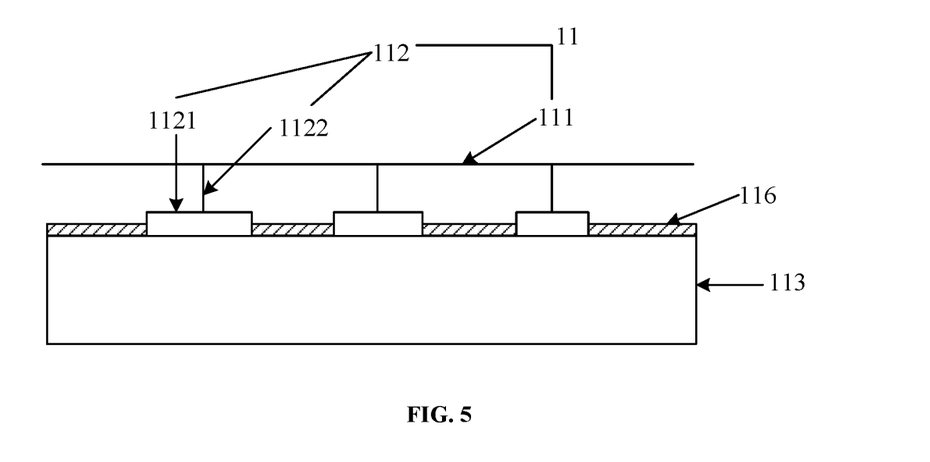
FIG. 5 is a locally schematic diagram of a cross-sectional structure of the screen plate assembly shown in FIG. 3.

FIG. 5 is a locally schematic diagram of a cross-sectional structure of the screen plate assembly shown in FIG. 3 after S504 ends. The transparent substrate 113 is provided with a light-shielding material layer 116.

In S305, the light-shielding film layer is formed by curing the light-shielding material layer, wherein a hole is formed at a position, corresponding to each of the plurality of shielding structures, of the light-shielding film layer.

Optionally, the light-shielding film layer may be formed by thermally curing the light-shielding material layer. The light-shielding material layer is thermally cured at 140 to 160° C. and for 0.3 to 0.7 hours.

Thermal curing includes: forming the light-shielding material layer on the transparent substrate from the light-shielding material, placing the screen plate assembly and the transparent substrate into a high-temperature furnace, and forming the light-shielding film layer by hot melting.

The light-shielding film layer obtained by thermal curing is bonded to the transparent substrate, and thus it is hard to separate the light-shielding film layer from the transparent substrate, and a high stability is achieved. The light-shielding film layer obtained by curing may have significant performance in high-temperature resistance and aging resistance.

In S306, the plurality of shielding structures are removed.

During removing of the plurality of shielding structures, the screen plate assembly may be clamped via instruments, such that the screen plate assembly can be separated from the transparent substrate to achieve an effect of removing the plurality of shielding structures from the transparent substrate.

In S307, a peripheral region of the transparent substrate is removed.

The peripheral region of the transparent substrate may be configured to implement some auxiliary functions in the manufacture process. After the light-shielding film layer is formed on the transparent substrate, the peripheral region of the transparent substrate may be removed to reduce the size of the light-mixing plate, thereby preventing the light-mixing plate from affecting assembly and usage of another structure in the backlight module.

The peripheral region of the transparent substrate may be removed in a cutter wheel cutting fashion, or a laser cutting fashion.

Each assembly used in each step of the method can be cleaned and dried prior to or upon each operation in the step.

In summary, the present disclosure provides a method for manufacturing a light-mixing plate. The method includes: forming a light-shielding film layer on a transparent substrate by disposing a plurality of shielding structures on the transparent substrate, such that holes are formed in regions, shielded by the plurality of shielding structures, of the light-shielding film layer. After the plurality of shielding structures are removed, the light-shielding film layer including a plurality of light-transmitting holes and the transparent substrate can implement a function of the light-mixing plate. According to the method, it is unnecessary to drill a hole in the transparent substrate, which reduces the possibility of damages to the transparent substrate. Therefore, the problem of a relative low manufacture yield of the light-mixing plate in the related art can be resolved, and the manufacture yield of the light-mixing plate can be improved.

The method according to the above embodiments may be applicable to forming a light-shielding film layer on the side of the transparent substrate. However, the method may be further applicable to forming form light-shielding film layers on two sides of the transparent substrate. In the case that the light-shielding film layers are formed on the two sides of the transparent substrate, holes in the light-shielding film layers on the two sides may be opposite to each other.

An embodiment of the present disclosure further provides a light-mixing plate. The light-mixing plate may be applicable in a backlight module, and may be manufactured by the method for manufacturing a light-mixing plate according to the above embodiments.

The light-mixing plate may include a transparent substrate and a light-shielding film layer disposed on the transparent substrate. The light-shielding film layer is provided with a plurality of holes.

Figure 6:
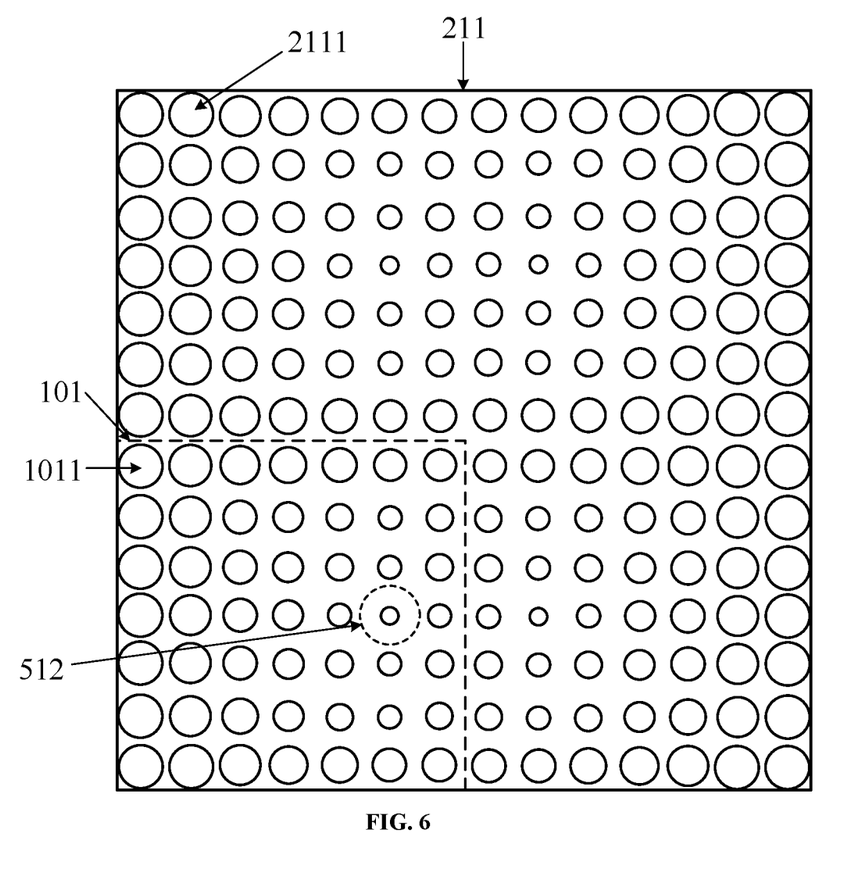
FIG. 6 is a schematic diagram of a top-viewed structure of a light-mixing plate according to an embodiment of the present disclosure.

FIG. 6 is a schematic diagram of a top-viewed structure of a light-mixing plate according to an embodiment of the present disclosure. As shown in FIG. 6, the light-shielding film layer 211 is disposed on the transparent substrate; and the light-shielding film layer 211 is provided with a plurality of holes 2111.

With such configuration, an effect that light penetrates through the holes but does not penetrate other regions can be achieved without drilling holes in the light-mixing plate.

In summary, the present disclosure provides a light-mixing plate including a transparent substrate and a light-shielding film layer disposed on the transparent substrate. The light-shielding film layer is provided with a plurality of holes. That is, the light-mixing plate is provided with a plurality of light-transmitting holes, thereby achieving a light-homogenizing effect. The light-mixing plate can achieve an effect that light penetrates through the holes but does not penetrate other regions of the transparent substrate without drilling holes in the light-mixing plate, which reduces the possibility of damages to the transparent substrate. Therefore, the problem of a relative low manufacture yield of the light-mixing plate in the related art can be resolved, and the manufacture yield of the light-mixing plate can be improved.

Optionally, a material of the light-shielding film layer includes a reflecting material.

The light-mixing plate may be used with the base substrate, and a light source may be present between the base substrate and the light-mixing plate.

Because the material of the light-shielding film layer includes the reflecting material, light irradiated by the light source on a region where the light-shielding film layer is disposed can be reflected to the base substrate, thereby changing a path of the light, and disturbing a transmission direction of the light. Therefore, the light-homogenizing effect of the light-mixing plate can be enhanced.

Optionally, the reflecting material includes white oil. The white oil may be a reflecting material whose model is Sekisui SFR-6-KSF-B2R802.

Optionally, the radius of the hole in the light-shielding film layer ranges from 0.225 mm to 0.625 mm. Compared with the radius of a micron-level hole in the related art, the size of the hole in the light-mixing plate according to the embodiments of the present disclosure is relatively large, thereby reducing technical difficulty in the manufacture process.

The minimum distance between the centers of any adjacent two of the plurality of holes is greater than 2 mm. Therefore, a spacing between adjacent holes can be relatively large, which can reduce manufacture difficulty of the light-mixing plate. In addition, the minimum distance between the centers of any adjacent two of the plurality of holes may be less than 3 mm.

Figure 7:
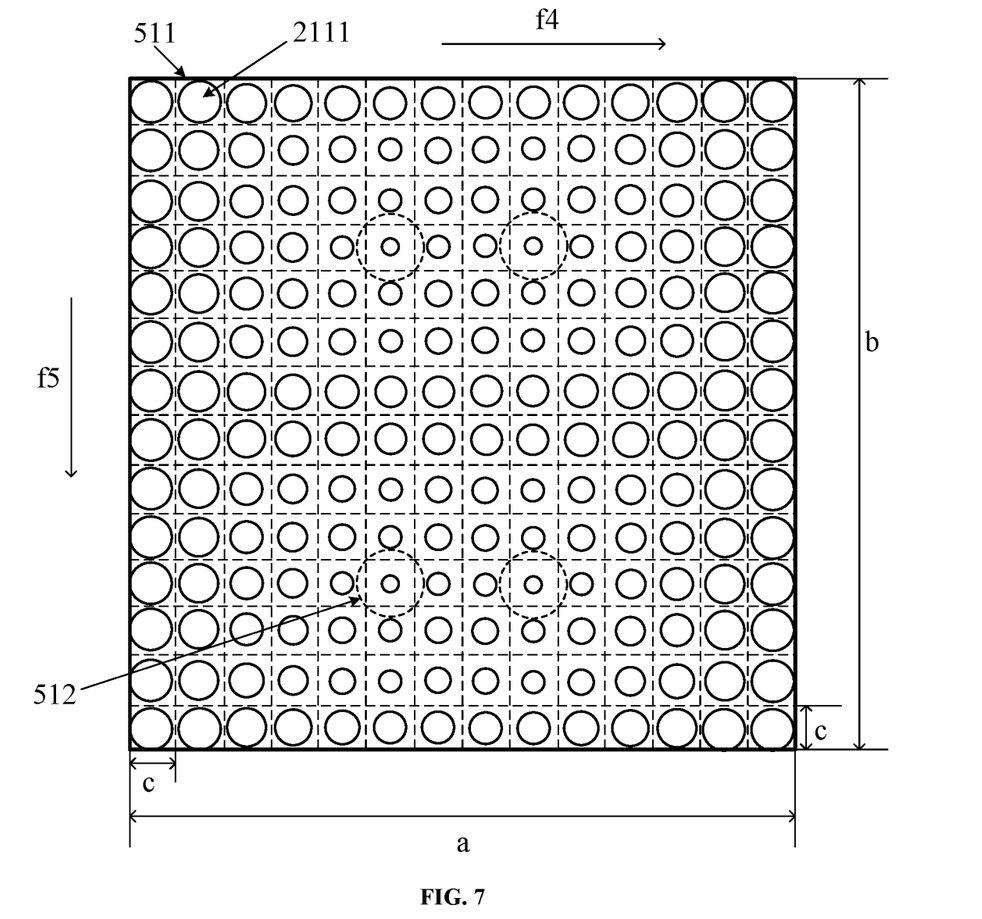
FIG. 7 is a schematic partitioned view of a light-mixing plate according to an embodiment of the present disclosure.

Optionally, the holes in the light-mixing plate may be formed in a partitioned fashion. In this fashion, the light-mixing plate may be divided into a plurality of equal mesh regions. Each mesh region may be provided with a hole. A light-homogenizing performance of the light-mixing plate can be adjusted by adjusting the size of the hole in each mesh region.

FIG. 7 is a schematic partitioned view of a light-mixing plate according to an embodiment of the present disclosure. The light-mixing plate is provided with a plurality of mesh regions 511.

The light-mixing plate is in a rectangular shape. Determining the hole in the light-mixing plate may include: in the case that the width of the light-mixing plate is a, the length of the light-mixing plate is b, setting the hole in a circle shape and the mesh region 511 in a square shape; dividing the light-mixing plate into n regions along a length direction f4 of one edge of the light-mixing plate, wherein the edge length of the mesh region 511 is determined as c and c is equal to a divided by b; and determining a quantity of regions m along the length direction f5 of the other edge of the light-mixing plate, wherein m is equal to b divided by c because the mesh region 511 is in a square shape.

For example, the light-mixing plate is divided into 14 regions along the length direction f4 of an edge of the light-mixing plate. The edge length of the mesh region 511 is determined as c, and c is equal to a divided by b. Then, the quantity of regions m in the length direction f5 of another edge of the light-mixing plate is determined, wherein m is equal to b divided by c and is 15 because the mesh region 511 is in a square shape.

For brightness uniformity of a light-emitting face, the area of a hole 2111 relatively proximal to a light-emitting device 512 may be relatively small, so as to prevent excessive light from passing through the hole. In the case that the area of the hole 2111 relatively proximal to the light-emitting device 512 is relatively large, relatively more light is caused to pass through the hole.

On this basis, one hole is opened in each mesh region. A light-mixing plate in a 12.3-inch vehicle-mounted direct backlight module is taken as an example. The light-mixing plate may be provided with 3900 holes. Central positions of the holes are coincident with central positions of the mesh regions. The central position of each hole is kept unchanged, and the size of the hole may be changed based on the distance between the hole and a light source. Based on a standard that backlight uniformity of the backlight module is greater than or equal to 80%, the radius range of a circular hole may be 0.545 mm to 1.45 mm. Because the radius range is greater than the radius of the hole in the light-mixing plate in the related art, difficulty of a manufacture technology of the light-mixing plate can be reduced. The backlight uniformity being greater than or equal to 80% means that a ratio of the minimum illuminance value to the maximum illuminance value of the backlight module is greater than or equal to 80%.

As shown in FIG. 7, each mesh region 511 is provided with a hole 2111. The hole 2111 may be disposed in the center of the mesh region 511, such that the centers of a plurality of holes 2111 may be uniformly distributed on a light-shielding film layer (the term "uniformly distributed" may mean that a quantity of holes in a unit area of the light-shielding film layer is fixed). Therefore, on the premise that manufacture difficulty of the light-mixing plate is reduced, the light-homogenizing effect of the light-mixing plate can be enhanced. The center of the hole may be a geometric center or a center of gravity.

Figure 8:
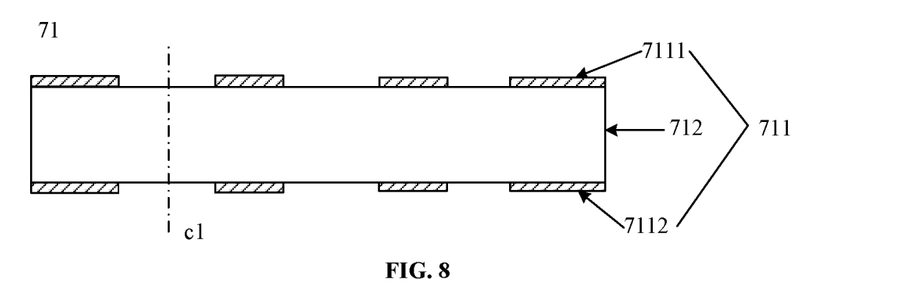
FIG. 8 is a locally sectional view of a light-mixing plate according to an embodiment of the present disclosure.

Optionally, the transparent substrate includes a top face, a bottom face, and a side face connecting the top face to the bottom face, and the light-shielding film layer includes a first light-shielding film layer disposed on the top face and a second light-shielding film layer disposed on the bottom face. FIG. 8 is a locally sectional view of a light-mixing plate according to an embodiment of the present disclosure. As shown in FIG. 8, the light-shielding film layer 711 includes a first light-shielding film layer 7111 disposed on the top face of the transparent substrate 712 and a second light-shielding film layer 7112 disposed on the bottom face of the transparent substrate 712.

Optionally, as shown in FIG. 8, holes in the first light-shielding film layer 7111 are in a one-to-one correspondence with and opposite to holes in the second light-shielding film layer 7112. That is, central axes of the holes in the first light-shielding film layer 7111 are correspondingly coincident with central axes of the holes in the second light-shielding film layer 7112, and all the central axes are cl, thereby forming the light-mixing plate 71 provided with the light-transmitting holes.

In summary, the present disclosure provides a light-mixing plate. The light-mixing plate includes a transparent substrate and a light-shielding film layer disposed on the transparent substrate. The light-shielding film layer is provided with a plurality of holes. That is, the light-mixing plate is provided with a plurality of light-transmitting holes, thereby achieving a light-homogenizing effect. The light-mixing plate can achieve an effect that light penetrates through the holes but does not penetrate other regions of the transparent substrate without drilling holes in the light-mixing plate, which reduces the possibility of damages to the transparent substrate. Therefore, the problem of a relative low manufacture yield of the light-mixing plate in the related art can be resolved, and the manufacture yield of the light-mixing plate can be improved.

An embodiment of the present disclosure further provides a backlight module.

Figure 9:
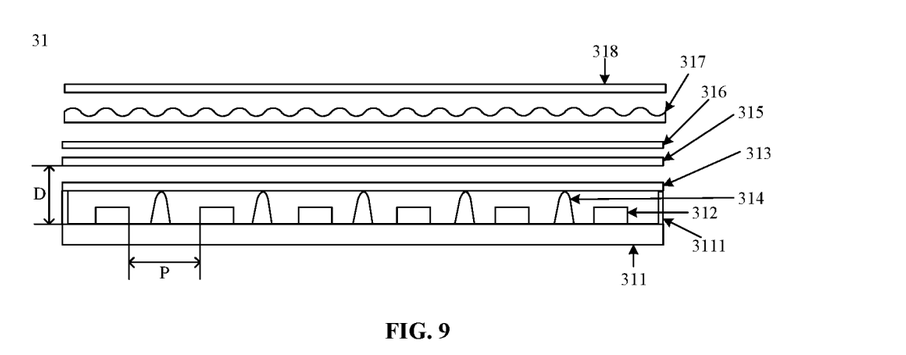
FIG. 9 is a schematic structural diagram of a backlight module according to an embodiment of the present application.

FIG. 9 is a schematic structural diagram of a backlight module according to an embodiment of the present application. As shown in FIG. 9, The backlight module may be a direct backlight module.

The backlight module 31 includes: a base substrate 311, a plurality of light-emitting devices 312, a light-mixing plate 313, a diffuser plate 315, a diffuser film 316, a brightness enhancement film (BEF) 317, and a dual brightness enhancement film (DBEF) 318. The light-mixing plate 313 may be any light-mixing plate according to the above embodiments.

The BEF may be an optical thin film manufactured according to a micro-prism technology. A face of the BEF has a micro-prism structure of about 20 microns height. A brightness enhancement principle of the BEF is that original divergent light with a large viewing angle is gathered in a relatively small angle range to emit, thereby enhancing brightness of the emitted light. The DBEF is a multi-layer film made of two materials that respectively have a high refractive index and a low refractive index.

The plurality of light-emitting devices 312 are disposed on the base substrate 311. The light-mixing plate 313 is disposed on a side, distal from base substrate 311, of the plurality of light-emitting devices 312.

Each of the light-emitting devices 312 may include a light-emitting diode (LED). The LED is a light-emitting device using a solid semiconductor chip as a light-emitting material. Compared with the conventional incandescent lamp, an LED lamp is energy-saving, environmentally friendly, and better in color rendering property and response speed. In addition, the light-emitting device 312 may further include a mini-LED. The mini-LED is an LED chip whose size is in a 100-micron dimension. Compared with the conventional LED, the mini-LED has better brightness, contrast, and color representability.

Figure 10:
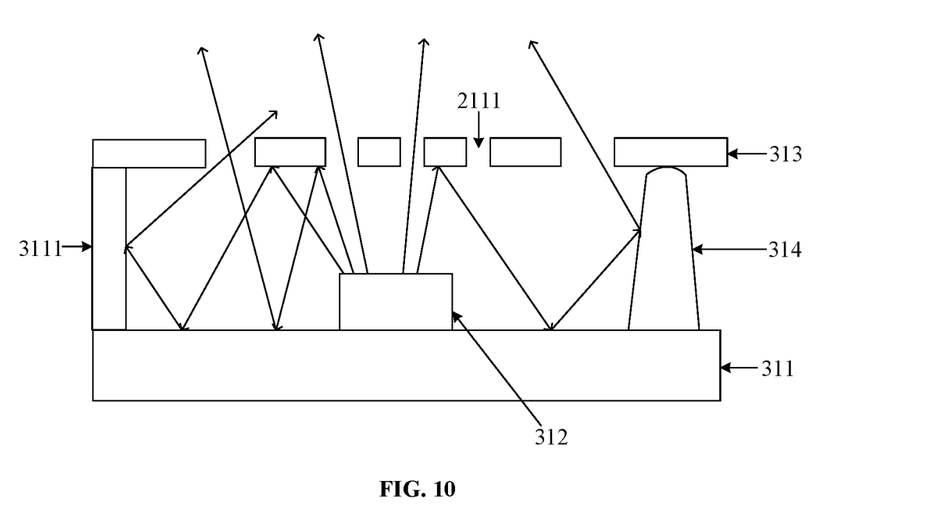
FIG. 10 is a schematic diagram of a local structure of the backlight module shown in FIG. 9.

FIG. 10 is a schematic diagram of a local structure of the backlight module shown in FIG. 9. As shown in FIG. 10, The backlight module further includes support pillars 314 disposed between the light-mixing plate 313 and the base substrate 311. The support pillars 314 are configured to support the light-mixing plate 313. The side face of each support pillar 31 may be coated with one layer of a reflecting material. A side, proximal to the light-mixing plate 313, of the base substrate 311 may be coated with one layer of the reflecting material. An edge of the base substrate 311 is provided with a reflective plate 3111. The reflecting material and the reflective plate 3111 can reflect light radiated on the base substrate and the reflective plate, thereby improving utilization of light emitted by the light-emitting device 312.

One or more light-emitting units 312 may be disposed between two support pillars 314. For example, the base substrate may be provided with a plurality of columns of support pillars. The plurality of columns of support pillars may divide the base substrate into a plurality of regions, and each region may be provided with two columns of light-emitting units.

Referring to the above embodiments, the light-mixing plate 313 is provided with a light-shielding film layer. The light-shielding film layer is provided with a plurality of holes 2111. A material of the light-shielding film layer includes a reflecting material, such that light radiated on the light-shielding film layer can be reflected, thereby changing a path of the light.

The light-emitting device 312 emits light beams. Some light beams are emitted through the plurality of holes 2111, and the other light beams are reflected by the light-mixing plate 313. The support pillars 314, the reflective plate 3111, and the base substrate 311 that are coated with the reflecting material can further reflect the light beams reflected by the light-mixing plate 313, thereby changing a path of light, disturbing an original transmission path of the light beams, and making the light beams to be radiated on other positions of the light-mixing plate 313 and be emitted through different holes 2111 in the light-shielding film layer. Therefore, the light dispersing effect of the light-mixing plate 313 can be enhanced, thereby enhancing the light-homogenizing effect of the light-mixing plate 313.

Optionally, as shown in FIG. 6, the light-mixing plate includes a plurality of light-mixing regions. The plurality of light-mixing regions are in one-to-one correspondence with the plurality of light-emitting devices. An orthographic projection of each light-emitting device on the light-mixing plate falls within a corresponding light-mixing region. In a first light-mixing region 101 of the plurality of light-mixing regions, the size of a first hole 1011 is positively correlated with a first distance, and the first distance is a distance between the first hole 1011 and a light-emitting device 512 corresponding to the first light-mixing region.

It should be noted that, the term "positively correlated" means that two variables change in the same direction, that is, when one variable becomes smaller or larger, the other variable also becomes smaller or larger. In other words, a gradient of a tangent of a data curve is always greater than 0. In the case of positive correlation, one variable changes with another in the same direction (the two variables become larger or smaller simultaneously). A variable causing a change is referred to as an independent variable (namely, a variable that changes actively), and another change is referred to as a dependent variable (namely, a variable that changes with the independent variable).

As shown in FIG. 10, the size of the hole relatively proximal to the light-emitting device 312 is relatively small, and the size of the hole relatively distal from the light-emitting device 312 is relatively large. Light at a position relatively proximal to the light-emitting device has relatively high intensity, and light at a position relatively distal from the light-emitting device has relatively low intensity. In the embodiments of the present disclosure, the size of the hole relatively proximal to the light-emitting device is relatively small, and the size of the hole relatively distal from the light-emitting device is relatively large. Therefore, light emitted through the hole relatively proximal to the light-emitting device may be avoided being too bright, and light emitted through the hole relatively distal from the light-emitting device may be avoided being too weak. In this way, intensity of light emitted through the holes is balanced, thereby improving the light-homogenizing effect of the light-mixing plate.

The diffuser plate may correct a diffusion angle of light beams in the backlight module, such that a light radiation area can be enlarged. However, in a use process, light intensity in a unit area may be reduced. After being diffused by the diffuser plate, a light source emitted by the light-emitting device becomes a light source having a larger area, better uniformity, high softness, and stable chroma.

The backlight module may be partitioned, and brightness of the backlight module may be adjusted based on partitioning. Therefore, the backlight module has relatively high picture color expression, luminance uniformity, and contrast. However, in the related art, the backlight module is usually thick, and is hard to be lightened and thinned.

As shown in FIG. 9, a distance between adjacent light-emitting devices of the backlight module is P, a distance between a plane where a light source is disposed and the diffuser plate is D. In the related art, to avoid lamp shadows, a value of D/P is generally equal to 1:1. In the embodiment of the present disclosure, the backlight module can be lightened and thinned in a fashion of reducing the value of D/P. The fashion of reducing the value of D/P may be: adding a light-mixing plate between the diffuser plate and the light-emitting device, to improve uniformity of light irradiated on the diffuser plate. In this way, the distance D between the plane where the light source is disposed and the diffuser plate can be reduced, thereby achieving the effect of reducing the value of D/P. Each light-emitting device may include at least one LED. For example, each light-emitting device may include two, three, or more LEDs, which is not limited in the embodiments of the present disclosure.

The light-mixing plate is disposed between the diffuser plate and the light-emitting device. The light-mixing plate can reduce the distance between the light-emitting device and the diffuser plate on the premise of diffusing light uniformly.

In a process of manufacturing the light-mixing plate in the embodiments of the present disclosure, the light-mixing plate is reasonably partitioned. Mesh regions are in one-to-one correspondence with holes, such that the thickness of the backlight module is reduced, and light irradiated on a light-emitting face of the backlight module is uniform in the case that a quantity of holes is relatively small. For example, the value of D/P of the backlight module may be reduced to 1:6, and the thickness of the backlight module may be less than or equal to 10 mm, thereby lightening and thinning the backlight module.

Figure 13:
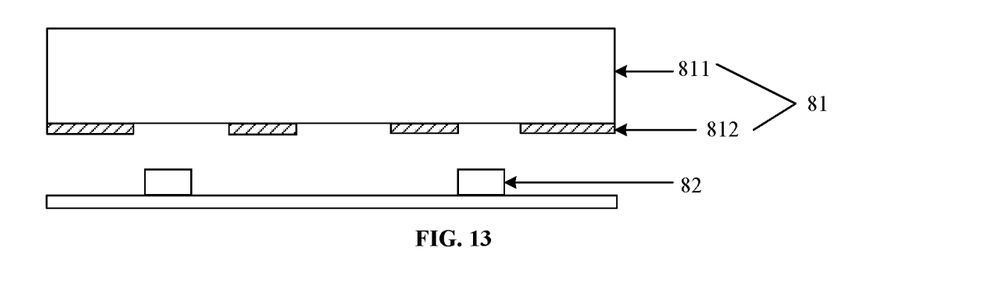
FIG. 13 is a locally schematic diagram of a backlight module according to an embodiment of the present application.

Optionally, FIG. 13 is a locally schematic diagram of a backlight module according to an embodiment of the present application. As shown in FIG. 13, in a light-mixing plate 81 of the backlight module, a light-shielding film layer 812 is disposed on a side, proximal to a light-emitting device 82, of a transparent substrate 811.

Figure 14:
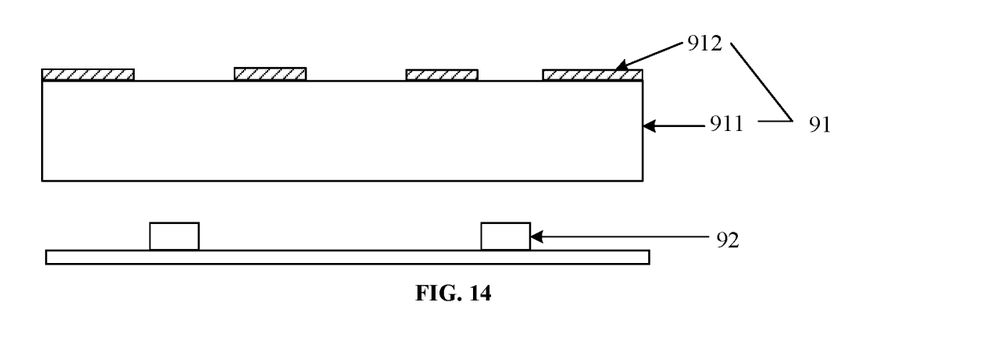
FIG. 14 is a locally schematic diagram of another backlight module according to an embodiment of the present application.

Optionally, FIG. 14 is a locally schematic diagram of another backlight module according to an embodiment of the present application. As shown in FIG. 14, in a light-mixing plate 91 of the backlight module, a light-shielding film layer 912 is disposed on a side, distal from a light-emitting device 92, of a transparent substrate 911.

In summary, the present disclosure provides a backlight module including a base substrate, a plurality of light-emitting devices, and a light-mixing plate. The light-mixing plate in the backlight module includes a transparent substrate and a light-shielding film layer disposed on the transparent substrate and provided with holes, such that the light-shielding film layer and the transparent substrate can implement a function of the light-mixing plate. During manufacture of the light-mixing plate, a hole is not drilled in the transparent substrate, which reduces a damage possibility of the transparent substrate. Therefore, a problem that a manufacture yield of a light-mixing plate is relatively low in the related art can be resolved, and an effect of improving the manufacture yield of the light-mixing plate can be achieved.

In addition, the light-mixing plate in the backlight module is disposed between the diffuser plate and the light-emitting device, such that uniformity of light irradiated on the diffuser plate can be improved, and a distance between the light source and the diffuser plate can be reduced. Therefore, the backlight module is lightened and thinned, which resolves a problem that the backlight module is relatively thick and heavy.

Figure 11:
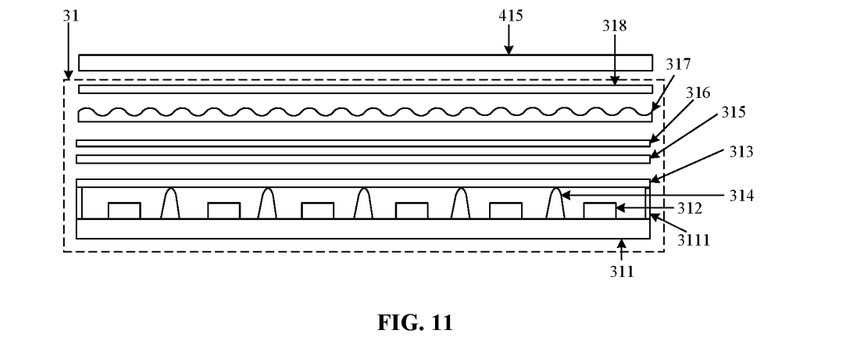
FIG. 11 is a schematic structural diagram of a display device according to an embodiment of the present disclosure.

An embodiment of the present disclosure further provides a display device. The display device includes a backlight module and a display panel. For the backlight module, reference may be made to the backlight module in the above embodiments. FIG. 11 is a schematic structural diagram of a display device according to an embodiment of the present disclosure. As shown in FIG. 11, the display device includes a backlight module 31 and a display panel 415. Each backlight module 31 may be relatively light and thin, such that the thickness of the display device can be reduced, and the display device can be lightened and thinned.

Figure 12:
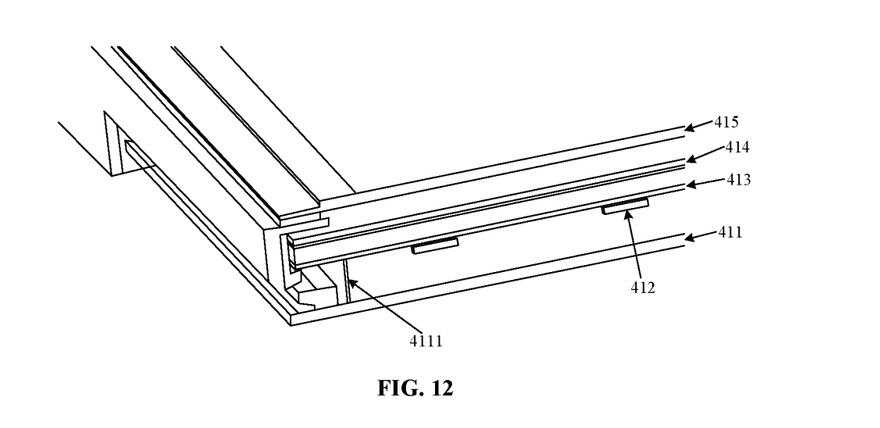
FIG. 12 is a schematic structural diagram of another display device according to an embodiment of the present disclosure.

FIG. 12 is a schematic structural diagram of another display device according to an embodiment of the present disclosure. The display device may be a vehicle-mounted direct backlight module. A plurality of light-emitting devices 412 are disposed on the base substrate 411. A light-mixing plate 413, a membrane material assembly 414, and a display panel 415 are sequentially disposed on a side, distal from the base substrate 411, of the plurality of light-emitting devices 412.

The membrane material assembly 414 may include a diffuser plate, a diffuser film, a BEF, and a DBEF. An edge of the base substrate 411 may be provided with a reflective plate 4111. The reflective plate 4111 is configured to prevent the display device from leaking light and improve performance of the light-mixing plate 413.

In the present disclosure, the terms "first" and "second" are used only for descriptive purposes and cannot be construed as indicating or implying of relative importance. Unless otherwise specified, the term "a plurality of" means two or more.

Described above are merely optional embodiments of the present disclosure, but are not intended to limit the present disclosure. Any modifications, equivalent replacements, improvements and the like made within the spirit and principles of the present disclosure should fall within the scope of protection of the present disclosure.

What is claimed is:

1. A method for manufacturing a light-mixing plate, wherein the light-mixing plate is applicable to a backlight module, and the method comprises:
   disposing a plurality of shielding structures on a transparent substrate;
   forming a light-shielding film layer on the transparent substrate where the plurality of shielding structures are disposed, wherein a hole is formed at a position, corresponding to each of the plurality of shielding structures, of the light-shielding film layer; and
   removing the plurality of shielding structures;
   wherein a radius of the hole ranges from 0.225 mm to 1.45 mm; and a minimum distance between centers of any adjacent two holes of a plurality of holes is greater than 2 mm.

2. The method according to claim 1, wherein forming the light-shielding film layer on the transparent substrate where the plurality of shielding structures are disposed comprises:
   forming a light-shielding material layer on the transparent substrate where the plurality of shielding structures are disposed; and forming the light-shielding film layer by curing the light-shielding material layer.

3. The method according to claim 2, wherein forming the light-shielding material layer on the transparent substrate where the plurality of shielding structures are disposed comprises:
   forming the light-shielding material layer by applying a light-shielding material onto the transparent substrate by a sprayer or a brush head.

4. The method according to claim 2, wherein forming the light-shielding film layer by curing the light-shielding material layer comprises:
   forming the light-shielding film layer by thermally curing the light-shielding material layer, wherein the light-shielding material layer is thermally cured at 140° C. to 160° C. and for 0.3 to 0.7 hours.

5. The method according to claim 2, wherein forming the light-shielding material layer on the transparent substrate where the plurality of shielding structures are disposed comprises:
   forming the light-shielding material layer by placing the transparent substrate where the plurality of shielding structure are disposed into a light-shielding material.

6. A light-mixing plate, applicable to a backlight module, comprising:
   a transparent substrate; and
   a light-shielding film layer disposed on the transparent substrate, wherein the light-shielding film layer is provided with a plurality of holes;
   wherein a radius of the hole ranges from 0.225 mm to 1.45 mm; and a minimum distance between centers of any adjacent two holes of a plurality of holes is greater than 2 mm.

7. The light-mixing plate according to claim 6, wherein a material of the light-shielding film layer comprises a reflecting material.

8. The light-mixing plate according to claim 7, wherein the reflecting material comprises white oil.

9. The light-mixing plate according to claim 6, wherein the transparent substrate comprises a top face, a bottom face, and a side face connecting the top face to the bottom face; and the light-shielding film layer comprises a first light-shielding film layer disposed on the top face and a second light-shielding film layer disposed on the bottom face.

10. The light-mixing plate according to claim 9, wherein holes in the first light-shielding film layer are in one-to-one correspondence with and opposite to holes in the second light-shielding film layer.

11. The light-mixing plate according to claim 9, wherein the centers of the plurality of holes are uniformly distributed in the light-shielding film layer.

12. A backlight module, comprising: a base substrate, a plurality of light-emitting devices, and the light-mixing plate as defined in claim 6; wherein the plurality of light-emitting devices are disposed on the base substrate, and the light-mixing plate is disposed on a side, distal from the base substrate, of the plurality of light-emitting devices.

13. The backlight module according to claim 12, wherein the light-mixing plate comprises a plurality of light-mixing regions; wherein the plurality of light-mixing regions are in one-to-one correspondence with the plurality of light-emitting devices, and an orthographic projection of each of the plurality of light-emitting devices on the light-mixing plate falls within a corresponding light-mixing region; wherein in a first light-mixing region of the plurality of light-mixing regions, a size of a first hole is positively correlated with a first distance, the first distance being a distance between the first hole and the light-emitting device corresponding to the first light-mixing region.

14. The backlight module according to claim 12, wherein in the light-mixing plate, the light-shielding film layer is disposed on a side, proximal to the light-emitting device, of a transparent substrate; or
   the light-shielding film layer is disposed on a side, distal from the light-emitting device, of the transparent substrate.

* * * * *